(12) United States Patent  
Dubey

(10) Patent No.: US 8,638,175 B2  
(45) Date of Patent: Jan. 28, 2014

(54) COUPLED RING OSCILLATOR

(75) Inventor: Prashant Dubey, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 52 days.

(21) Appl. No.: 13/177,460

(22) Filed: Jul. 6, 2011

(65) Prior Publication Data

US 2012/0161883 A1 Jun. 28, 2012

(30) Foreign Application Priority Data

Dec. 28, 2010 (IN) .......................... 3127/DEL/2010

(51) Int. Cl.
*H03K 3/03* (2006.01)
*H03L 7/24* (2006.01)

(52) U.S. Cl.
USPC ............... 331/57; 331/47; 331/50; 331/55; 331/76

(58) Field of Classification Search
USPC ............... 331/2, 45–50, 54–57, 74, 76, 77, 331/117 FE, 117 R, 158, 167, 172
See application file for complete search history.

(56) References Cited

U.S. PATENT DOCUMENTS

| | | | | |
|---|---|---|---|---|
| 3,304,518 A * | 2/1967 | Mackey | ........................ | 332/144 |
| 3,626,315 A * | 12/1971 | Stirling et al. | .................. | 331/69 |
| 3,810,038 A * | 5/1974 | Hershberg et al. | ............. | 331/60 |
| 4,453,138 A * | 6/1984 | Scheer | ............................. | 331/47 |
| 4,613,828 A * | 9/1986 | Collette | ........................... | 331/47 |
| 4,737,737 A * | 4/1988 | Khanna | ............................ | 331/47 |
| 5,646,562 A * | 7/1997 | Abe | ................................ | 327/156 |
| 6,091,306 A * | 7/2000 | Fenk | ................................ | 331/47 |
| 6,252,469 B1 * | 6/2001 | Suematsu | ................ | 331/117 D |
| 6,317,008 B1 * | 11/2001 | Gabara | .................... | 331/117 R |
| 6,617,936 B2 * | 9/2003 | Dally et al. | ...................... | 331/57 |
| 6,867,656 B2 * | 3/2005 | Hajimiri et al. | .................. | 331/45 |
| 8,362,848 B2 * | 1/2013 | Raghunathan et al. | ....... | 331/186 |
| 2006/0001496 A1 * | 1/2006 | Abrosimov et al. | ............ | 331/57 |
| 2007/0052483 A1 * | 3/2007 | Dietl et al. | ........................ | 331/2 |
| 2010/0085123 A1 * | 4/2010 | Frans et al. | ..................... | 331/47 |

OTHER PUBLICATIONS

York, Robert A., et al., *Oscillator Array Dynamics with Broadband N-Port Coupling Networks*, IEEE Transactions on Microwave Theory and Techniques, vol. 42, No. 11, Nov. 1994, pp. 2040-2045.

Hossain, Masum et al., *CMOS Oscillators for Clock Distribution and Injection-Locked Deskew*, IEEE Journal of Solid-State Circuits, vol. 44, No. 8, Aug. 2009, pp. 2138-2153.

Chang, Heng-Chia, et al., *Phase Noise in Coupled Oscillators: Theory and Experiment*, IEEE Transactions on Microwave Theory and Techniques, vol. 45, No. 5, May 1997, pp. 604-615.

(Continued)

*Primary Examiner* — Levi Gannon

(74) *Attorney, Agent, or Firm* — Wolf, Greenfield & Sacks, P.C.

(57) ABSTRACT

A circuit including a first oscillator configured to oscillate at a first frequency; a second oscillator configured to oscillate at a second frequency, the second frequency being different from and one of a harmonic or sub-harmonic of the first frequency; and a coupling between the first oscillator and the second oscillator configured to injection lock at least one of the first oscillator and second oscillator to the other of the first oscillator and second oscillator.

19 Claims, 4 Drawing Sheets

(56) References Cited

OTHER PUBLICATIONS

Mesgarzadeh, Behzad, et al., *A Study of Injection Locking in Ring Oscillators*, Circuits and Systems, 2005. IEEE International Symposium on May 23-26, 2005, pp. 5465-5468, vol. 6.

Hu, Kangmin et al., *A 0.6 mW/Gb/s, 6.4-7.2 Gb/s Serial Link Receiver Using Local Injection-Locked Ring Oscillators in 90 nm CMOS*, IEEE Journal of Solid-State Circuits, vol. 45, No. 4, Apr. 4, 2010, pp. 899-908.

\* cited by examiner

COUPLED RING OSCILLATOR

CROSS REFERENCE TO RELATED APPLICATIONS

This application claims the priority benefit of Indian patent application number 3127/Del/2010, filed on Dec. 28, 2010, entitled COUPLED RING OSCILLATOR, which is hereby incorporated by reference to the maximum extent allowable by law.

BACKGROUND OF THE INVENTION

1. Field on the Invention

The present invention relates to coupled ring oscillators, for example but not exclusively to coupled ring oscillators in integrated circuits.

2. Discussion of the Related Art

Oscillators are commonly used in radio frequency communication systems and many other applications, for example, to perform mixing or frequency translation of information signals and channel selection. Oscillators are generally also present in all digital electrical systems which require a time reference, for example a clock signal, in order to synchronize operations. The ideal oscillator would be one providing a perfect time reference however typical physical practical oscillators produce signals which contain undesired noise in the form of either amplitude or phase noise.

The performance of ring oscillators, a cascaded combination of delay stages connected in a closed loop have been of great interest to circuit designers for implementation as oscillators because of their useful features such as being easily implementable, being able to achieve oscillations with low voltages, providing high frequency oscillations with low power, being electrically tuneable over a wide tuning range and being able to be tuned whilst also providing a multi-phase output. The oscillation frequency of a ring oscillator depends on the propagation delay $T_d$ per stage and the number of stages used in the ring structure M. In order to achieve self-sustaining oscillations, the ring provides a phase shift where each stage provides a phase shift of $\pi/M$ for a M stage ring oscillator and an inversion provides the remaining phase shift of $\pi$. Ring oscillators have an inherent problem in that the faster a ring oscillator is to operate with a fixed delay stage the fewer the number of delay stages are required.

To overcome this problem coupled ring oscillators are known wherein two or more ring oscillators are coupled together in such a way that the system oscillates with an effect between the two oscillators. However in conventional coupled ring oscillators operating at low frequencies the compromise between phase noise or power consumption to reduce the phase noise can be problematic in oscillator design.

SUMMARY OF THE INVENTION

It is an aim of embodiments of the present application to overcome at least one of these problems.

According to a first aspect, there is provided a circuit comprising: a first oscillator configured to oscillate at a first frequency; a second oscillator configured to oscillate at a second frequency, the second frequency being different from and one of a harmonic or sub-harmonic of the first frequency; and a coupling between the first oscillator and the second oscillator configured to injection lock at least one of the first oscillator and second oscillator to the other of the first oscillator and second oscillator.

The coupling may comprise at least one of: a unilateral coupling from the first oscillator to the second oscillator; a unilateral coupling from the second oscillator to the first oscillator; and a bilateral coupling between the first oscillator and the second oscillator.

The coupling may comprise at least one of: a filter; a direct coupling; a level shifter; a diode; and an impulse generator.

The filter may comprise at least one of: a low pass filter configured to couple from a higher frequency oscillator to a lower frequency oscillator; a high pass filter configured to couple from a lower frequency oscillator to a higher frequency oscillator.

The first oscillator may comprise at least two oscillators.

At least one of the first oscillator of the at least two oscillators may comprise a crystal oscillator.

At least two oscillators from the first oscillator of the at least two oscillators may be homogeneously coupled such as to produce a low noise first frequency.

At least one oscillator from the first oscillator of the at least two oscillators may be configured to oscillate of the at a first frequency; and a second at least one oscillator from the first oscillator at least two oscillators may be configured to oscillate at a third frequency wherein the at least one oscillator from the first oscillator of the at least two oscillators and the second at least one oscillator from the first oscillator of the at least two oscillators may be heterogeneously coupled.

The first oscillator may comprise at least one of: a ring oscillator; an LC oscillator; a crystal oscillator; and a delay line oscillator.

The second oscillator may comprise at least one of: a ring oscillator; an LC oscillator; a crystal oscillator; and a delay line oscillator.

An integrated circuit may comprise a circuit as described herein.

A mixer may comprise a circuit as described herein.

A phase locked loop (PLL) may comprise a circuit as described herein.

An analog to digital converter (ADC) may comprise a circuit as described herein.

A communications device may comprise a circuit as described herein.

According to a second aspect, there is provided a method comprising: oscillating a first oscillator at a first frequency; oscillating a second oscillator at a second frequency, the second frequency being different from and one of a harmonic or sub-harmonic of the first frequency; and injection lock coupling between the first oscillator and the second oscillator.

Coupling may comprise performing at least one of: unilateral coupling from the first oscillator to the second oscillator; unilateral coupling from the second oscillator to the first oscillator; and bilateral coupling between the first oscillator and the second oscillator.

Coupling may comprise at least one of: filtering at least one output of the first oscillator and second oscillator; direct coupling at least one output of the first oscillator and the second oscillator; level shifting at least one output of the first oscillator and the second oscillator; diode coupling at least one output of the first oscillator and the second oscillator; and impulse generating at least one output of the first oscillator and the second oscillator.

Filtering may comprise performing at least one of: low pass filtering from the oscillator operating at a higher frequency to the oscillator operating at a lower frequency; and high pass filtering from the oscillator operating at a lower frequency to the oscillator operating at a higher frequency.

Oscillating a first oscillator at a first frequency may comprise oscillating at least two oscillators.

At least one of the first oscillator of the at least two oscillators may comprise a crystal oscillator.

Oscillating the at least two oscillators from the first oscillator may comprise homogeneously coupling the at least two oscillators such as to produce a low noise first frequency.

Oscillating at least two oscillators may comprise: oscillating at least one oscillator from the first oscillator of the at least two oscillators at the first frequency; oscillating a second at least one oscillator from the first oscillator of the at least two oscillators at a third frequency, the third frequency being different and one of a harmonic or sub-harmonic of the first frequency; and heterogeneously coupling the at least one oscillator from the first oscillator of the at least two oscillators and the second at least one oscillator from the first oscillator of the at least two oscillators.

The first oscillator may comprise at least one of: a ring oscillator; a LC oscillator; a crystal oscillator; and a delay line oscillator.

The second oscillator may comprise at least one of: a ring oscillator; a LC oscillator; a crystal oscillator; and a delay line oscillator.

According to a third aspect there is provided a computer-readable medium encoded with instructions that, when executed by a computer, perform: oscillating a first oscillator at a first frequency; oscillating a second oscillator at a second frequency, the second frequency being different from and one of a harmonic or sub-harmonic of the first frequency; and injection lock coupling between the first oscillator and the second oscillator.

Coupling may cause the computer to perform at least one of: unilateral coupling from the first oscillator to the second oscillator; unilateral coupling from the second oscillator to the first oscillator; and bilateral coupling between the first oscillator and the second oscillator.

Coupling may cause the computer to perform at least one of: filtering at least one output of the first oscillator and second oscillator; direct coupling at least one output of the first oscillator and second oscillator; level shifting at least one output of the first oscillator and second oscillator; diode coupling at least one output of the first oscillator and second oscillator; and impulse generating at least one output of the first oscillator and second oscillator.

Filtering may cause the computer to perform at least one of: low pass filtering from the oscillator operating at a higher frequency to the oscillator operating at a lower frequency; and high pass filtering from the oscillator operating at a lower frequency to the oscillator operating at a higher frequency.

Oscillating a first oscillator at a first frequency may cause the computer to perform oscillating at least two oscillators.

At least one of the first oscillator at least two oscillators may comprise a crystal oscillator.

Oscillating the at least two oscillators from the first oscillator may cause the computer to perform homogeneously coupling the at least oscillators such as to produce a low noise first frequency.

Oscillating at least two oscillators may cause the computer to perform: oscillating at least one oscillator from the first oscillator at least two oscillators at the first frequency; oscillating a second at least one oscillator from the first oscillator at least two oscillators at a third frequency, the third frequency being different and one of a harmonic or sub-harmonic of to the first frequency; and heterogeneously coupling the at least one oscillator from the first oscillator of the at least two oscillators and the second at least one oscillator from the first oscillator of the at least two oscillators.

The first oscillator may comprise at least one of: a ring oscillator; an LC oscillator; a crystal oscillator; and a delay line oscillator.

The second oscillator may comprise at least one of: a ring oscillator; an LC oscillator; a crystal oscillator; and a delay line oscillator.

According to a fourth aspect there is provided an apparatus comprising at least one processor and at least one memory including computer program code in the at least one memory and the computer program code configured to, with the at least one processor, cause the apparatus at least to perform: oscillating a first oscillator at a first frequency; oscillating a second oscillator at a second frequency, the second frequency being different from and one of a harmonic or sub-harmonic of the first frequency; and injection lock coupling between the first oscillator and the second oscillator.

Coupling may cause the apparatus to perform performing at least one of: unilateral coupling from the first oscillator to the second oscillator; unilateral coupling from the second oscillator to the first oscillator; and bilateral coupling between the first oscillator and the second oscillator.

Coupling may cause the apparatus to perform at least one of: filtering at least one output of the first oscillator and second oscillator; direct coupling at least one output of the first oscillator and the second oscillator; level shifting at least one output of the first oscillator and the second oscillator; diode coupling at least one output of the first oscillator and the second oscillator; and impulse generating at least one output of the first oscillator and the second oscillator.

Filtering may cause the apparatus to perform at least one of: low pass filtering from the oscillator operating at a higher frequency to the oscillator operating at a lower frequency; and high pass filtering from the oscillator operating at a lower frequency to the oscillator operating at a higher frequency.

Oscillating a first oscillator at a first frequency may cause the apparatus to perform oscillating at least two oscillators.

At least one of the first oscillator at least two oscillators may comprise a crystal oscillator.

Oscillating the at least two oscillators from the first oscillator may cause the apparatus to perform homogeneously coupling the at least two oscillators such as to produce a low noise first frequency.

Oscillating at least two oscillators may cause the apparatus to perform: oscillating at least one oscillator from the first oscillator of the at least two oscillators at the first frequency; oscillating a second at least one oscillator from the first oscillator of the at least two oscillators at a third frequency, the third frequency being different and one of a harmonic or sub-harmonic of the first frequency; and heterogeneously coupling the at least one oscillator from the first oscillator of the at least two oscillators and the second at least one oscillator from the first oscillator of the at least two oscillators.

The first oscillator may comprise at least one of: a ring oscillator; an LC oscillator; a crystal oscillator; and a delay line oscillator.

The second oscillator may comprise at least one of: a ring oscillator; an LC oscillator; a crystal oscillator; and a delay line oscillator.

According to a fifth aspect there is provided an apparatus comprising: means for oscillating at a first frequency; means for oscillating at a second frequency, the second frequency being different from and one of a harmonic or sub-harmonic of the first frequency; and means for injection lock coupling between the means for oscillating at a first frequency and the means for oscillating at a second frequency.

The means for injection lock coupling may comprise at least one of: means for unilateral coupling from the means for oscillating at a first frequency to the means for oscillating at a second frequency; means for unilateral coupling from the means for oscillating at a second frequency to the means for oscillating at a first frequency; and means for bilateral coupling between the means for oscillating at a first frequency and the means for oscillating at a second frequency.

The means for coupling may comprise at least one of: means for filtering; means for direct coupling; means for level shifting; means for diode coupling; and means for impulse generating.

Means for filtering may comprise: low pass filtering from the oscillator operating at a higher frequency to the oscillator operating at a lower frequency; and high pass filtering from the oscillator operating at a lower frequency to the oscillator operating at a higher frequency.

Means for oscillating at a first frequency may comprise at least two means for oscillating.

At least one of the at least two means for oscillating may comprise a crystal oscillator.

The at least two means for oscillating may comprise means for homogeneously coupling the at least two oscillators such as to produce a low noise first frequency.

The at least two means for oscillating may comprise: at least one means for oscillating at the first frequency; at least one means for oscillating at a third frequency, the third frequency being different and one of a harmonic or sub-harmonic of the first frequency; and means for heterogeneously coupling the at least one means for oscillating at the first frequency and the at least one means for oscillating at a third frequency.

The means for oscillating at a first frequency may comprise at least one of: a ring oscillator; an LC oscillator; a crystal oscillator; and a delay line oscillator.

The means for oscillating at a second frequency may comprise at least one of: a ring oscillator; an LC oscillator; a crystal oscillator; and a delay line oscillator.

BRIEF DESCRIPTION OF THE DRAWINGS

Reference will be made by way of example only to the accompanying drawings in which.

DETAILED DESCRIPTION

This document describes apparatus and methods for operating coupled ring oscillators. The embodiments of the application aim to produce an improvement over present approaches.

Figure 1:
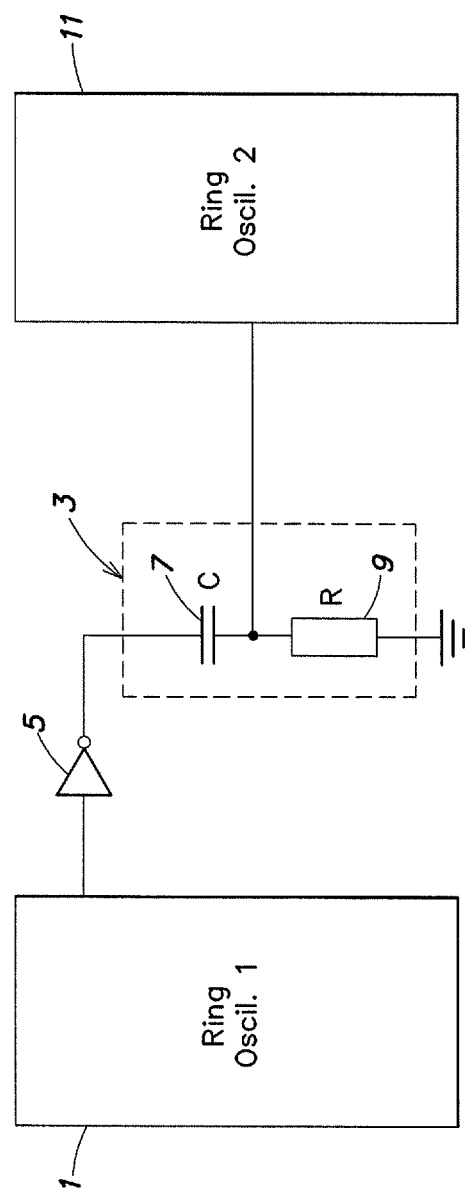
FIG. 1 shows schematically an overview of a coupled ring oscillator device according to embodiments of the application.

With respect to FIG. 1, a coupled ring oscillator device is shown according to some embodiments of the application. The coupled ring oscillator device comprises a first ring oscillator 1, a second ring oscillator circuit ring oscillator 11, and a coupling arrangement configured to couple the first ring oscillator 1 to the second ring oscillator in a unilateral coupling. In other words, the coupling arrangement is a unidirectional coupling from the first ring oscillator circuit 1 to the second ring oscillator circuit 11. The coupling between the first ring oscillator 1 and the second ring oscillator 11 is a heterogeneous coupling in that the first ring oscillator is configured to oscillate at a frequency which is a harmonic or sub-harmonic of the second ring oscillator 11.

In some embodiments, the coupling arrangement configured to couple the first ring oscillator circuit 1 to the second ring oscillator circuit 11 can comprise an inverter 5 and a high pass filter 3. However, any suitable coupling arrangement can be used. For example, a low pass filter in one direction and a high pass filter in the other direction can be implemented in some embodiments can be used to form a bi-lateral coupling. Furthermore in some embodiments a unilateral coupling arrangement from a high frequency oscillator to a low frequency sub-harmonic frequency oscillator can comprise a low pass filter.

The inverter 5 can be implemented using any suitable device and be configured to implement a $\pi$ phase shift on the output of the first ring oscillator circuit 1 at any suitable point. The inverter 5 can furthermore in some embodiments be coupled to the high pass filter circuit 3.

The high pass filter circuit 3 can in some embodiments be configured to receive the output of the inverter as the input to be filtered and output a high pass filtered signal to the second ring oscillator circuit 11. In some embodiment the high pass circuit 3 is configured to remove or compensate for dc and low frequency noise and contamination from the first ring circuit 1. The high pass filter circuit 3 can comprise, as shown in FIG. 1, a capacitor (C) 7 and a resistor or load (R) 9 coupled in a high pass arrangement wherein the output of the inverter 5 is coupled to a first terminal of the capacitor 7 the second terminal of the capacitor 7 is coupled to the second ring oscillator circuit 11 and to the first terminal of the load 9 and the second terminal of the load 9 is coupled to a dc reference voltage (in the example shown in FIG. 1 the second terminal of the load 9 is coupled to the ground terminal).

In embodiments of the application, the first ring oscillator circuit 1 can be configured to have at least one ring oscillator which is configured to operate at a harmonic period with respect to the second ring oscillator circuit 11. In other words, the first ring oscillator circuit 1 is configured to operate at a first frequency and the second ring oscillator circuit 11 configured to operate at a frequency which is a harmonic of the first frequency.

Figure 2:
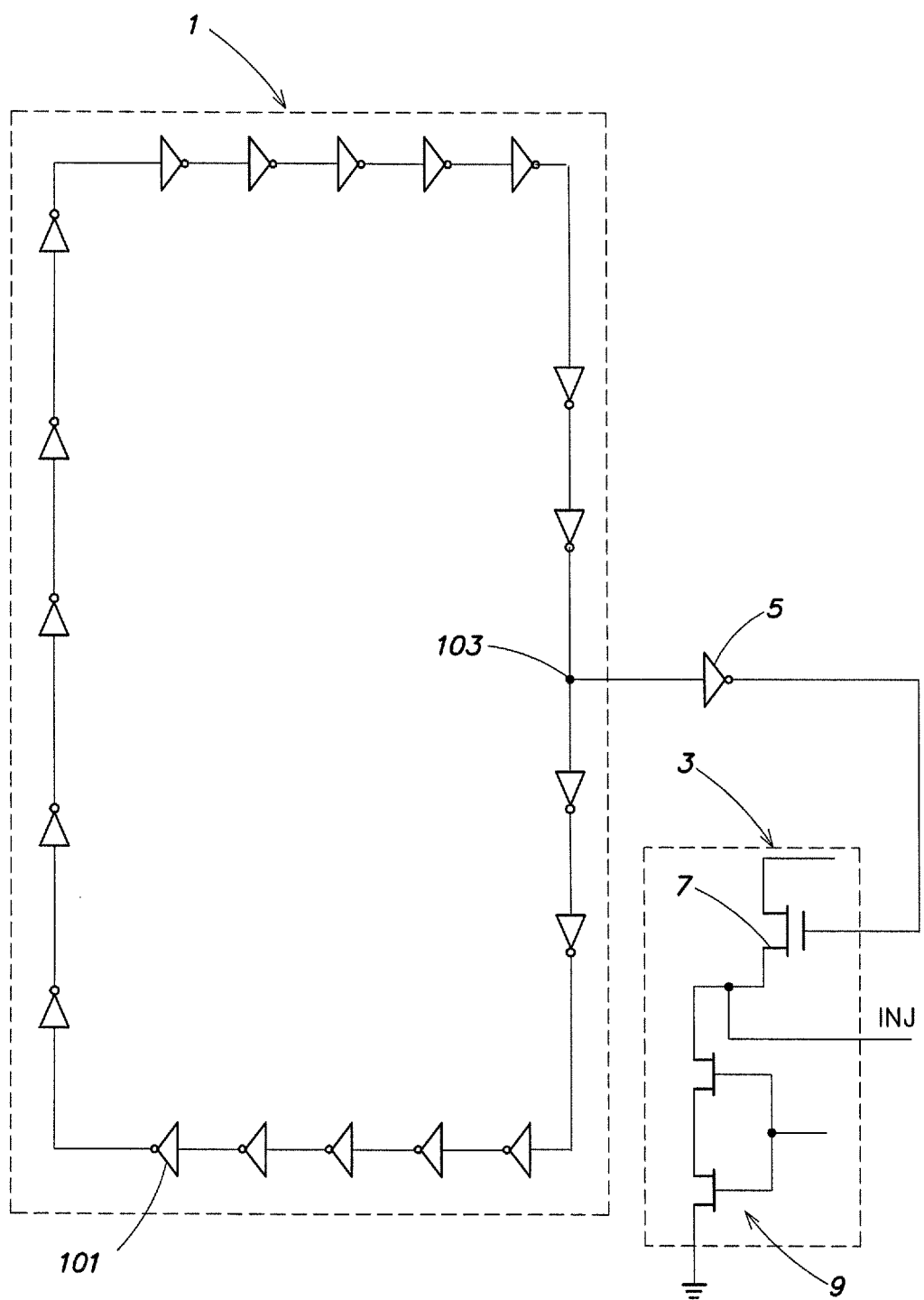
FIG. 2 shows schematically the first ring oscillator, inverter and high pass filter circuits as shown in FIG. 1 according to some embodiments of the application.

With respect to FIG. 2, the first ring oscillator circuit 1 according to some embodiments of the application is shown in further detail. The first ring oscillator 1 in such embodiments comprises a series of close coupled inverters 101. The example shown in FIG. 2, for example, shows a series of nineteen stages of inverters 101 wherein the output of an inverter is coupled to the input of a successive inverter and the output of the last inverter is coupled to the input of the first inverter to close the loop. The inverter 101 within the first ring oscillator can be implemented in any suitable technology including a differential inverter arrangement.

The first ring oscillator circuit 1 furthermore is configured to have an output 103 which can be the output of any one of the inverters 101. The output 103 of the first ring oscillator 1 as described herein is coupled to the input of the inverter 5.

The inverter 5 can be any suitable technology and output an inverted first ring oscillator circuit 1 signal to the input of the high pass filter 3.

The high pass filter 3 as described here comprises a capacitor. The capacitor can as shown in FIG. 2 be implemented as a transistor 7 configured to operate as a capacitor. Furthermore the high pass filter comprising a load can be implemented as a load coupled pair of transistors 9. The output of the high pass filter INJ, the junction between the capacitor and load is configured to be coupled to the second ring oscillator circuit 11.

Figure 3:
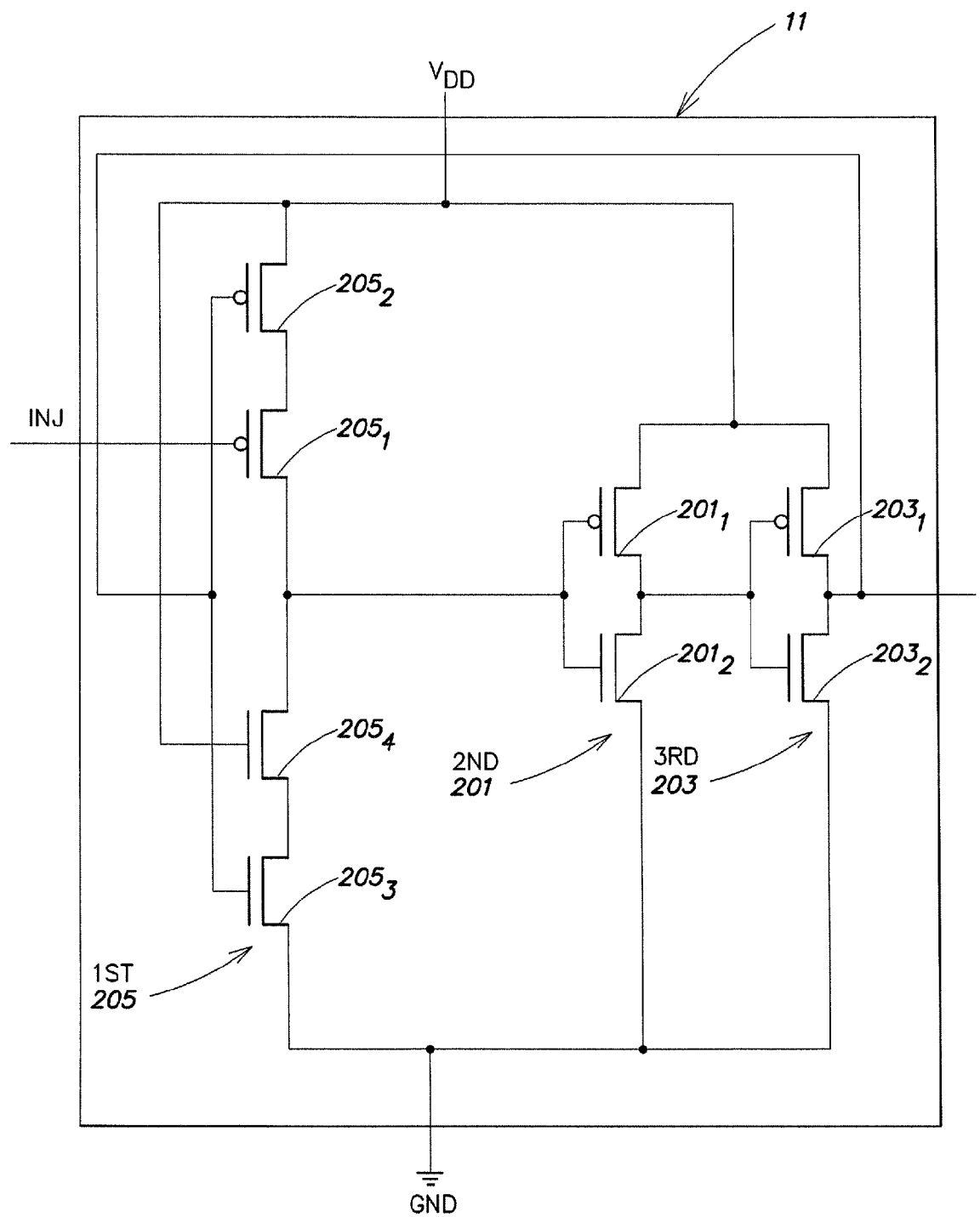
FIG. 3 shows schematically the second ring oscillator as shown in FIG. 1 according to some embodiments of the application.

With respect to FIG. 3, an example of the second ring oscillator circuit 11 according to some embodiments of the application is shown. The second ring oscillator 11 comprises a series of three inverters arranged in a close coupled configuration. In other words, the output of the last inverter is coupled to the input of the first inverter.

The first inverter 205 is configured in these embodiments to receive not only the inputs from the third inverter 203 but also the filtered inverted first ring oscillator circuit input. The first inverter comprises, in some embodiments, a first transistor $205_2$ a PMOS transistor, which has a source node coupled to the high reference voltage ($V_{dd}$), a drain node coupled to the source of a second transistor $205_1$ and a gate node configured to receive the output of the third inverter. The first inverter 205 further comprises a second transistor $205_1$, a PMOS transistor, which has a source node coupled to the drain node of the first transistor, a drain node coupled to the source node of the third transistor $205_4$, and a gate coupled to the filtered inverted first ring oscillator circuit input INJ, the injection locking input. The first inverter also comprises a third transistor $205_4$, a NMOS transistor, configured to have a source node coupled to the drain node of the second transistor $205_1$, a drain node coupled to the source node of a fourth transistor $205_3$ and a gate node coupled to a high reference voltage and therefore switching the third transistor 'on'. The first inverter 205 further comprises a fourth transistor $205_3$, a NMOS transistor, configured with a source node coupled to the drain of the third transistor $205_4$, a drain node coupled to a low reference voltage (GND), and the gate node coupled to the output of the third inverter. The output of the first inverter 205 is taken from the junction between the second transistor drain and the third transistor source nodes.

The second inverter 201 and third inverter 203 each comprise a pair of transistors arranged in a standard inverter configuration such that the input to each inverter is coupled to the gate node of a first transistor $201_1$, $203_1$, a PMOS transistor, and a second transistor $201_2$, $203_2$, a NMOS transistor, the source of the PMOS transistor is coupled to the high reference voltage, the drain of the PMOS connected to the source of the NMOS transistor, the drain of the NMOS transistor coupled to the low reference voltage, and the output taken from the NMOS source/PMOS drain output.

In such embodiments, the first inverter 205 can, at the gate of the second transistor $205_1$ receive the input from the output of the high pass filter via the injection locking input INJ. In other words, the coupling between the first ring circuit and the second ring circuit in the example shown is both one or unidirectional and heterogeneous in that the first ring oscillator has a oscillation frequency which is a sub-harmonic of the second ring oscillator.

Furthermore, as the second ring oscillator circuit 11 is configured operate at a higher frequency than the lower frequency oscillator, the first ring oscillator circuit 1 the harmonic coupling produces an improved noise output for the second ring oscillator circuit 11 than a conventional single ring oscillator but with a power consumption which is less than a conventional homogeneous coupled oscillator system. The performance improvement can be seen as being a noise improvement generated due to the injection locking whereby the first oscillator ring produces a signal which locks or stabilizes the second oscillator ring. Furthermore, as in this example the first oscillator ring is operating at a frequency lower than the second oscillator ring, the power consumption of the first oscillator ring is less than the second oscillator ring operating at the higher frequency and therefore the combination of the oscillator rings has a power consumption lower than two ring oscillators operating at the second oscillator ring frequency as used in a conventional homogeneously coupled oscillator system.

Although the embodiments of the application described herein show the example harmonic coupling produced by a 19 stage to 3 stage coupled ring oscillator device it would be to understood that in some further embodiments other harmonics can be selected to provide a suitable coupling ring oscillator device. For example, coupling a 3 stage oscillator with a 21 stage oscillator using such high pass filter and inverter logic can provide an injection locked improvement in noise of 20 dB (improvement in phase noise) with increased current of only 5-6×.

In examples of oscillators employing embodiments of the application low frequency phase noise can be very low such as −140 dBc/Hz at 1 MHz with an offset of 8 MHz.

Furthermore it would be understood that power consumption of circuits employing embodiments of the application can also be low. For example the circuit shown herein with respect to FIGS. 2 and 3 would be approximately 40 µW.

Although a two oscillator harmonic heterogeneous coupling is shown in the examples herein it would be understood that in some embodiments heterogeneous harmonic couplings could be employed between more than two oscillators. Furthermore in some embodiments there can, for example, be a chain of linked oscillators wherein at least one of the chain of couplings is a heterogeneous coupling. Furthermore although the oscillators shown herein are close coupled inverters it would be understood that in some embodiments other suitable oscillators can be used.

Thus, for example, in some embodiments a first oscillator could be a conventional crystal oscillator which is coupled to a chain of heterogeneously coupled ring oscillators in order to supply a range of frequencies at harmonics or sub-harmonics of the crystal oscillator.

Furthermore in some embodiments at least one of the oscillators forming the chain of oscillators can itself comprise a cluster of linked oscillators. For example, a first frequency could be generated by at least two homogeneously coupled ring oscillators of which at least one is coupled to a second (higher) frequency ring oscillator. In such an example the first frequency is injection locked by the homogeneous couplings between the first frequency oscillators and thus have a much lower noise level than a single first frequency oscillator but this reduced noise first frequency oscillation can injection lock the second frequency oscillator to produce a low noise second frequency signal but requiring current and power at much lower levels than if there were multiple second frequency oscillators homogeneously coupled.

Figure 4:
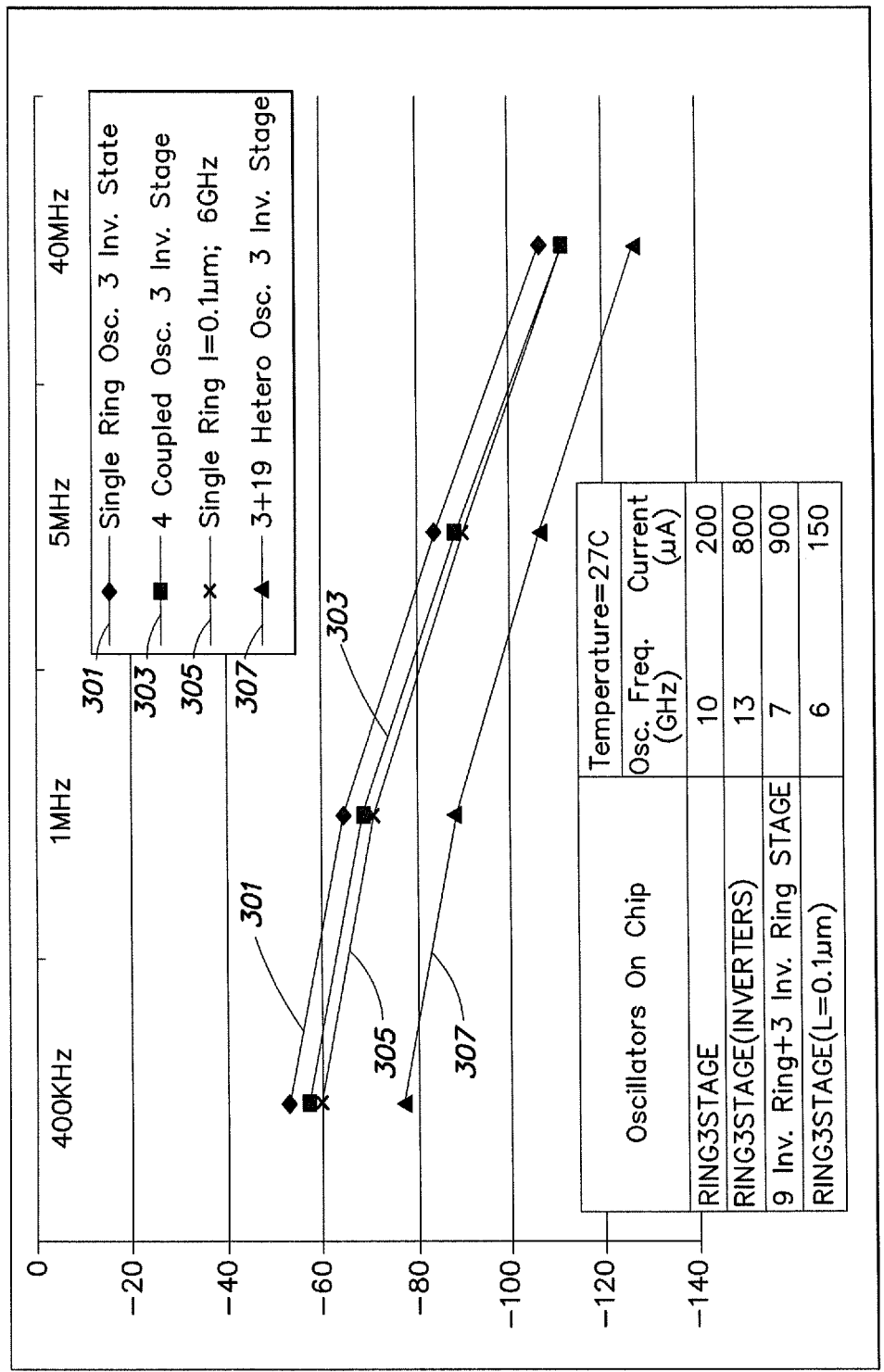
FIG. 4 shows schematically a graph of the improvements of a simulated coupled ring oscillator device according to some embodiments of the application.

As shown in FIG. 4 the improvement of signal noise against frequency is shown for embodiments of the application. Thus the graph shown in FIG. 4 shows noise against frequency plots for a single ring oscillator with three inversion stages 301, a four coupled oscillator from three inversion stages 303, a single ring oscillator operating at high frequencies to 6 GHz 305, and the example heterogeneous coupled oscillator 307 whereby the heterogeneous oscillator has a significantly lower noise plot for all frequencies for a current which is only 6× the single 3 stage ring example simulation.

In general, the various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The embodiments of this application can be implemented by computer software executable by a data processor, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions. The software may be stored on such physical media as memory chips, or memory blocks implemented within the processor, magnetic media such as hard disk or floppy disks, and optical media such as for example DVD and the data variants thereof, CD.

The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

As used in this application, the term 'circuitry' can refer to hardware-only circuit implementations (such as implementations in only analog and/or digital circuitry) and to combinations of circuits and software (and/or firmware), such as: to a combination of processor(s) or (ii) to portions of processor(s)/software (including digital signal processor(s)), to software, and memory(ies) that work together to cause an apparatus, such as a mobile phone or server, to perform various functions and to circuits, such as a microprocessor(s) or a portion of a microprocessor(s), that require software or firmware for operation, even if the software or firmware is not physically present.

This definition of 'circuitry' applies to all uses of this term in this application, including any claims As a further example, as used in this application, the term 'circuitry' would also cover an implementation of a processor (or multiple processors) or portion of a processor and its (or their) accompanying software and/or firmware.

Whilst this detailed description has set forth some embodiments of the present invention, the appended claims cover other embodiments of the present application which differ from the described embodiments according to various modifications and improvements. Other applications and configurations may be apparent to the person skilled in the art.

What is claimed is:

1. A circuit comprising:
    at least one first ring oscillator configured to oscillate at a first frequency;
    a second ring oscillator configured to oscillate at a second frequency, the second frequency being different from the first frequency and one of a harmonic or sub-harmonic of the first frequency; and
    a coupling between the at least one first ring oscillator and the second ring oscillator configured to injection lock at least one of the at least one first ring oscillator and the second ring oscillator to the other of the at least one first ring oscillator and the second ring oscillator, wherein:
        the second ring oscillator comprises a plurality of inverters, an inverter from the plurality of inverters comprising at least two transistors; and
        a gate of a transistor of the at least two transistors is coupled to an output from the coupling via an injection locking input.

2. The circuit as claimed in claim 1, wherein the coupling comprises at least one of:
    a unilateral coupling from the at least one first ring oscillator to the second ring oscillator;
    a unilateral coupling from the second ring oscillator to the at least one first ring oscillator; and
    a bilateral coupling between the at least one first ring oscillator and the second ring oscillator.

3. The circuit as claimed in claim 1, wherein the coupling comprises at least one of:
    a filter;
    a direct coupling;
    a level shifter;
    a diode; and
    an impulse generator.

4. The circuit as claimed in claim 3, wherein the filter comprises at least one of:
    a low pass filter configured to couple from a higher frequency ring oscillator to a lower frequency ring oscillator;
    a high pass filter configured to couple from a lower frequency ring oscillator to a higher frequency ring oscillator.

5. The circuit as claimed in claim 1, wherein the at least one first ring oscillator comprises at least two oscillators.

6. The circuit as claimed in claim 5, wherein at least two oscillators from the at least two oscillators are homogeneously coupled such as to produce a low noise first frequency.

7. The circuit as claimed in claim 5, wherein:
    at least one oscillator from the at least two oscillators is configured to oscillate at a first frequency;
    a second at least one oscillator from the at least two oscillators is configured to oscillate at a third frequency; and
    the at least one oscillator from the at least two oscillators and the second at least one oscillator from the at least two oscillators are heterogeneously coupled.

8. An integrated circuit comprising a circuit as claimed in claim 1.

9. A mixer comprising a circuit as claimed in claim 1.

10. A phase locked loop (PLL) comprising a circuit as claimed in claim 1.

11. An analog to digital converter (ADC) comprising a circuit as claimed in claim 1.

12. A communications device comprising a circuit as claimed in claim 1.

13. A method comprising:
    oscillating at least one first ring oscillator at a first frequency;
    oscillating a second ring oscillator at a second frequency, the second frequency being different from the first frequency and one of a harmonic or sub-harmonic of the first frequency; and
    injection lock coupling between the at least one first ring oscillator and the second ring oscillator to form an injection lock coupling, wherein:

the second ring oscillator comprises a plurality of inverters, an inverter from the plurality of inverters comprising at least two transistors; and the method further comprises coupling a gate of a transistor of the at least two transistors to an output from the injection lock coupling via an injection locking input.

14. The method as claimed in claim 13, wherein coupling comprises performing at least one of:

unilateral coupling from the at least one first ring oscillator to the second ring oscillator;

unilateral coupling from the second ring oscillator to the at least one first ring oscillator; and bilateral coupling between the at least one first ring oscillator and the second ring oscillator.

15. The method as claimed in claim 13, wherein coupling comprises at least one of:

filtering at least one output of the at least one first ring oscillator and the second ring oscillator;

direct coupling at least one output of the at least one first ring oscillator and the second ring oscillator;

level shifting at least one output of the at least one first ring oscillator and the second ring oscillator;

diode coupling at least one output of the at least one first ring oscillator and the second ring oscillator; and impulse generating at least one output of the at least one first ring oscillator and the second ring oscillator.

16. The method as claimed in claim 15, wherein filtering comprises performing at least one of:

low pass filtering from a ring oscillator operating at a higher frequency to a ring oscillator operating at a lower frequency;

high pass filtering from the ring oscillator operating at a lower frequency to the ring oscillator operating at a higher frequency.

17. The method as claimed in claim 13, wherein the oscillating the at least one first ring oscillator at a first frequency comprises oscillating at least two oscillators.

18. The method as claimed in claim 17, wherein oscillating the at least two oscillators from the at least one first ring oscillator comprises homogeneously coupling the at least two oscillators such as to produce a low noise first frequency.

19. The method as claimed in claim 17, wherein oscillating at least two oscillators comprises oscillating at least one oscillator from the first ring oscillator of the at least two oscillators at the first frequency; and oscillating a second at least one oscillator from the first ring oscillator of the at least two oscillators at a third frequency, the third frequency being different and one of a harmonic or sub-harmonic of the first frequency; and heterogeneously coupling the at least one oscillator from the first ring oscillator of the at least two oscillators and the second at least one oscillator from the first ring oscillator of the at least two oscillators.

* * * * *

UNITED STATES PATENT AND TRADEMARK OFFICE
CERTIFICATE OF CORRECTION

| | | |
|---|---|---|
| PATENT NO. | : 8,638,175 B2 | Page 1 of 1 |
| APPLICATION NO. | : 13/177460 | |
| DATED | : January 28, 2014 | |
| INVENTOR(S) | : Prashant Dubey | |

It is certified that error appears in the above-identified patent and that said Letters Patent is hereby corrected as shown below:

**In the Specification:

At column 8, line 9, please delete the second occurrence of the word "to" which was added in that line;

At column 8, line 59, please delete the word "to" which was added in that line; and At column 9, line 41, please delete the first occurrence of the word "to" which was added in that line.**

Signed and Sealed this
Third Day of June, 2014

Michelle K. Lee
*Deputy Director of the United States Patent and Trademark Office*